(12) United States Patent
Li

(10) Patent No.: US 9,261,750 B2
(45) Date of Patent: Feb. 16, 2016

(54) ARRAY SUBSTRATE, METHOD FOR FABRICATING THE SAME AND LIQUID CRYSTAL PANEL

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventor: Fan Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 14/368,134

(22) PCT Filed: Jun. 5, 2013

(86) PCT No.: PCT/CN2013/076806
§ 371 (c)(1),
(2) Date: Jun. 23, 2014

(87) PCT Pub. No.: WO2014/153838
PCT Pub. Date: Oct. 2, 2014

(65) Prior Publication Data
US 2015/0123135 A1 May 7, 2015

(30) Foreign Application Priority Data
Mar. 25, 2013 (CN) .......................... 2013 1 0097318

(51) Int. Cl.
*G02F 1/1368* (2006.01)
*H01L 27/12* (2006.01)
*G02F 1/1362* (2006.01)
*G02F 1/1333* (2006.01)

(52) U.S. Cl.
CPC ........ *G02F 1/1368* (2013.01); *G02F 1/133345* (2013.01); *G02F 1/136227* (2013.01); *G02F 1/136286* (2013.01); *H01L 27/124* (2013.01); *H01L 27/1259* (2013.01); *G02F 2001/13685* (2013.01); *G02F 2001/136295* (2013.01)

(58) Field of Classification Search
CPC ................... G02F 1/133345; G02F 1/136227; G02F 1/1368; G02F 2001/136295; G02F 2001/13685; H01L 27/124; H01L 27/1259
See application file for complete search history.

(56) References Cited

U.S. PATENT DOCUMENTS

2005/0140570 A1* 6/2005 Tabatake et al. ............... 345/3.1

FOREIGN PATENT DOCUMENTS

| CN | 102403320 A | 4/2012 |
| CN | 102466931 A | 5/2012 |

OTHER PUBLICATIONS

Machine Translation of CN102403320.*
International Search Report Appln. No. PCT/CN2013/076806.
First Chinese Office Action Appln. No. 201310097318.1; Dated Jan. 28, 2015.
International Preliminary Report on Patentability issued Sep. 19, 2015; PCT/CN2013/076806.

* cited by examiner

*Primary Examiner* — Tucker J Wright
(74) *Attorney, Agent, or Firm* — Ladas & Parry LLP

(57) ABSTRACT

An array substrate, a method for fabricating the same and a liquid crystal panel are disclosed. The array substrate includes a display region and a frame region surrounding the display region. The display region includes a plurality of data lines, a plurality of scan lines and a plurality of scan connection lines. The plurality of data lines and the plurality of scan lines intersect each other to divide the display region into a plurality of pixel regions. The plurality of scan lines are electrically connected to the plurality of scan connection lines in a one-to-one correspondence in the display region.

17 Claims, 6 Drawing Sheets

ARRAY SUBSTRATE, METHOD FOR FABRICATING THE SAME AND LIQUID CRYSTAL PANEL

FIELD OF THE ART

Embodiments of the invention relate to liquid crystal display technologies, more particularly, to an array substrate, a method for fabricating the same and a liquid crystal panel comprising the array substrate.

BACKGROUND

Flat panel displays are currently the most popular displays, of which liquid crystal displays (LCDs) are widely used in electronic devices such as computer display screens, mobile phones and so on for being light and thin, power saving and radiation-less.

Generally, a LCD comprises a liquid crystal panel; the liquid crystal panel comprises a color filter substrate, an array substrate disposed opposed to the color filter substrate and a liquid crystal layer disposed between the color filter substrate and the array substrate. A surface of the array substrate which is opposite to the color filter substrate comprises a display region and a frame region surrounding the display region. The display region comprises a plurality of data lines, a plurality of scan lines and a plurality of scan connection lines. The plurality of data lines and the plurality of scan lines intersect each other to divide the display region into a plurality of pixel regions. The plurality of scan connection lines are disposed in the frame region and each of them is used to electrically connect the scan line with a driver circuit.

As the plurality of scan connection lines are disposed in the frame region, the liquid crystal panel of the liquid crystal display has relatively wide frame, thus reducing the utilization ratio of the liquid crystal panel.

To solve the above problem, CN102466931A discloses an array substrate as illustrated in FIG. 1. In the drawing, a region on the left side of the dotted line is the frame region, and that on the right side of the dotted line is the display region. The scan connection lines of the array substrate are disposed in the display regions, and are electrically connected to the scan lines by extending to the frame region, thereby reducing the width of the frame region. However, the scan line and the scan connection lines are still electrically connected in the frame region, which makes it impossible to further reduce the width of the frame region.

SUMMARY

Embodiments of the invention provide an array substrate, a method for fabricating the same and a liquid crystal panel comprising the above array substrate. The array substrate has a narrow frame region.

An aspect of the invention provides an array substrate; the array substrate comprises a display region and a frame region surrounding the display region, the display region comprising a plurality of data lines, a plurality of scan lines and a plurality of scan connection lines, the plurality of data lines and the plurality of scan lines intersect each other to divide the display region into a plurality of pixel regions, wherein the plurality of scan lines are electrically connected to the plurality of scan connection lines in a one-to-one correspondence in the display region.

As an example, the scan connection line comprises a vertical portion and a horizontal portion, the horizontal portion is electrically connected to the scan line, and the vertical portion is disposed parallel to the data line.

As an example, at least a part of the vertical portion overlaps with the data line in a direction perpendicular to the substrate.

As an example, the array substrate has a top-gate configuration, the array substrate further comprises a bridge connection line; the scan line is electrically connected to the scan connection line by way of the bridge connection line.

As an example, the bridge connection line is disposed in the same layer as the data line, the scan connection line is disposed in the same layer as the scan line, the bridge connection line is electrically connected to the scan line by way of a first via hole, the bridge connection line is electrically connected to the scan connection line by way of a second via hole.

As an example, a length direction of the bridge connection line is the same as that of the scan line, the bridge connection line is electrically connected to a corresponding scan connection line by way of at least two second via holes.

As an example, a protection layer is disposed on an insulating layer of the array substrate, a groove is disposed in the protection layer, the groove is disposed above an active layer of the array substrate, a part of the scan line is embedded in the groove.

As an example, the array substrate has a bottom-gate configuration, the scan connection line and a pixel electrode of the array substrate are disposed in the same layer, the scan connection line is electrically connected to the scan line by way of a third via hole.

Another aspect of the invention further provides a liquid crystal panel, wherein the liquid crystal panel comprises the above array substrate provided by the disclosure.

Still another aspect of the invention further provides a method for fabricating an array substrate, wherein the method comprises steps of:

providing a substrate, the substrate comprising a display region and a frame region; and forming, on the substrate, a plurality of data lines, a plurality of scan lines and a plurality of scan connection lines, the plurality of scan lines being electrically connected to the plurality of scan connection lines in a one-to-one correspondence in the display region.

As an example, the step of providing the substrate, the substrate comprising a display region and a frame region comprises:

forming an active layer pattern on the substrate;
forming the data line and a bridge connection line on the substrate having the active layer pattern formed thereon;
forming an insulating layer on the substrate having the data line and the bridge connection line formed thereon, the insulating layer overlaying the substrate;
forming a pixel electrode on the insulating layer;
forming a protection layer on the substrate having the pixel electrode formed thereon, the protection layer overlaying the substrate;
forming a first via holes and a second via hole on the substrate having the protection layer formed thereon, both the first via hole and the second via hole penetrating the insulating layer and the protection layer to reach the bridge connection line;
forming the scan line and the scan connection line on the protection layer, the scan line and the scan connection line being connected to the bridge connection line by way of the first via hole and the second via hole, respectively.

As an example, the protection layer is made of an organic material.

As an example, the step of forming the first via hole and the second via hole on the substrate having the protection layer formed thereon, both the first via hole and the second via hole penetrating the insulating layer and the protection layer to reach the bridge connection line further comprises:

forming a groove on the protection layer.

As an example, the step of forming the plurality of data lines, the plurality of scan lines and the plurality of scan connection lines on the substrate, the plurality of scan lines being electrically connected to the plurality of scan connection lines in a one-to-one correspondence in the display region comprises:

forming the scan line on the substrate;

forming an insulating layer on the substrate having the scan line formed thereon, the insulating layer overlaying the substrate;

forming an active layer pattern on the insulating layer;

forming the data line on the insulating layer;

forming a protection layer on the substrate having the data line formed thereon;

forming third via holes on the substrate having the protection layer formed thereon, the third via holes penetrate through the protection layer and the insulating layer to reach the scan line;

forming pixel electrodes and scan connection lines on the substrate having the third via holes, the scan connection line is electrically connected to the scan line by way of the third via hole.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In an aspect of the disclosure, as illustrated in FIGS. 2 to 4 and FIGS. 6 to 7, an array substrate is provided; the array substrate comprises a display region and a frame region surrounding the display region (not shown), the display region comprises a plurality of data lines 3, a plurality of scan lines 4 and a plurality of scan connection lines 2, the plurality of data lines 3 and the plurality of scan lines 4 intersect each other to divide the display region into a plurality of pixel regions, wherein the plurality of scan lines 4 are electrically connected to the plurality of scan connection lines 2 in a one-to-one correspondence in the display region.

Figure 3:
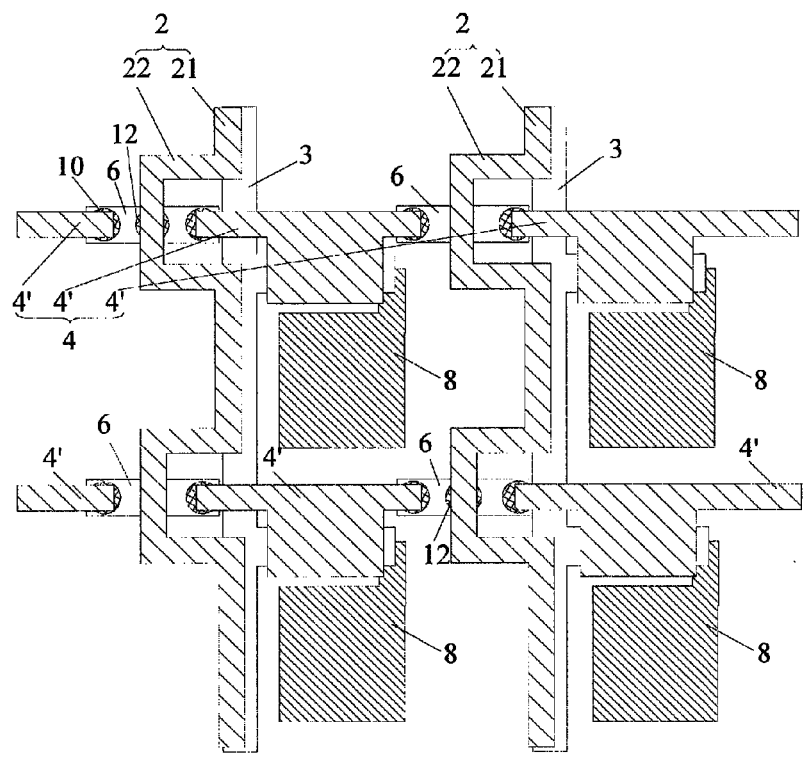
FIG. 3 schematically illustrates a top view of the array substrate of FIG. 2.

It will be understood by those skilled in the art that the two data lines 3 and the two scan lines 4 of the array substrate illustrated in FIG. 3 are for illustrative purpose only. Each gate electrode of TFTs in each row of the pixel regions is electrically connected to one corresponding scan line 4, each source electrode of TFTs in each column of the pixel regions is electrically connected to one corresponding data line 3, and each drain electrode is electrically connected to the pixel electrode 8 in the pixel region by way of a via hole.

Figure 1:
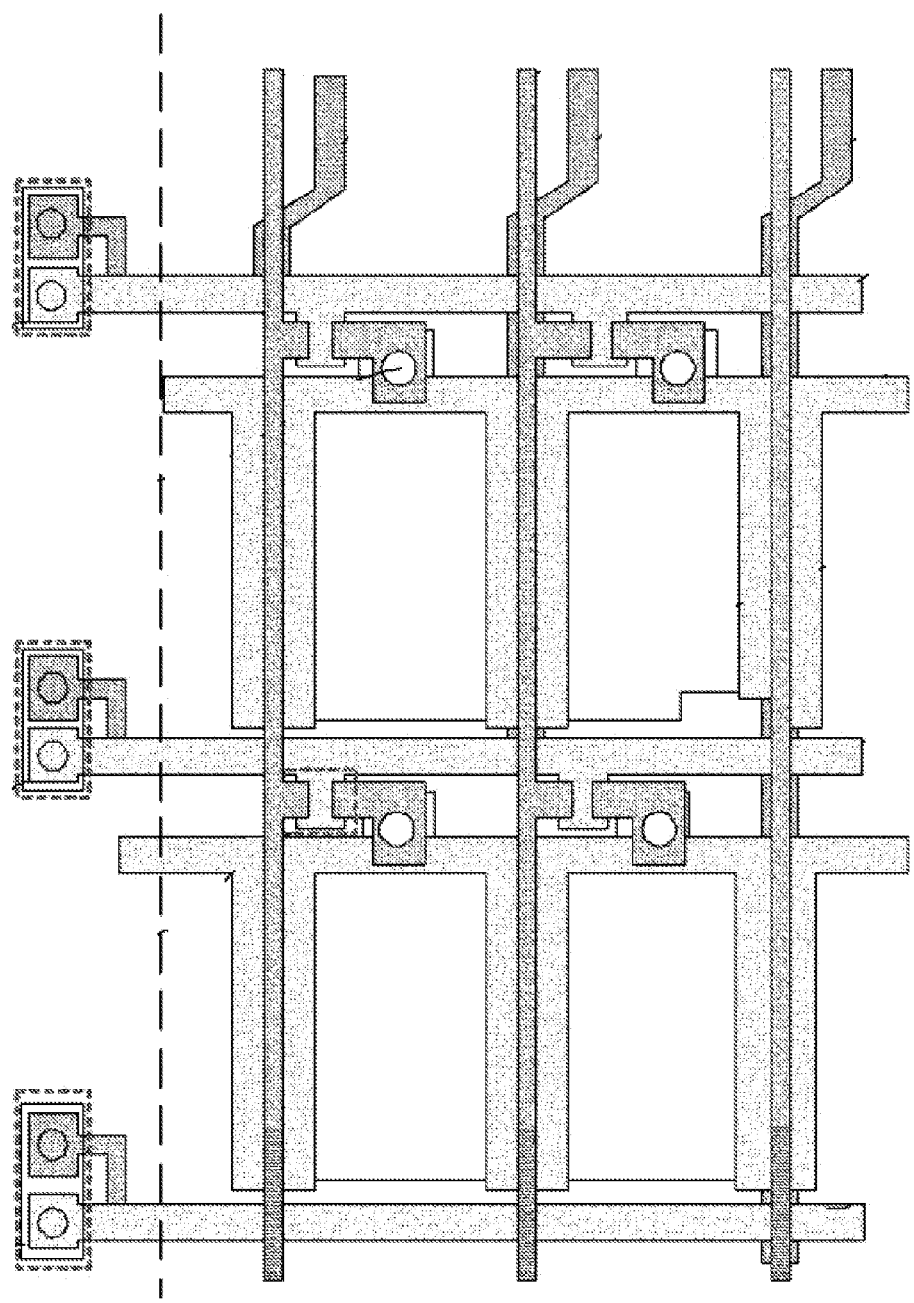
FIG. 1 schematically illustrates a known array substrate.
Figure 2:
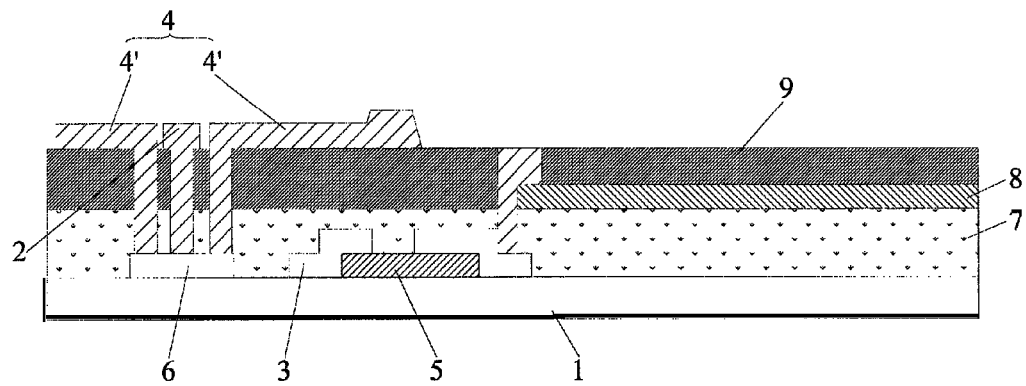
FIG. 2 schematically illustrates a cross section of an array substrate in accordance with a first implementation of the invention.

As illustrated in FIGS. 2 and 3, as the scan lines 4 and the scan connection lines 2 are electrically connected in the display region, the frame region will not be taken up. As a result, the array substrate provided by the disclosure has a narrower frame region.

In an example of the disclosure, to further reduce the width of the frame region, the scan connection lines 2 extend outside the display region along a substantially vertical direction (that is a direction parallel to the data lines 3) and are electrically connected to an external driver circuit. For the convenience of disposing the scan connection lines 2, in an example, with reference to FIGS. 3 and 8, each scan connection line 2 comprises a vertical portion 21 and a horizontal portion 22, the horizontal portion 22 is electrically connected to the scan line 4, and the vertical portion 21 is disposed parallel to the data line 3.

To increase the aperture ratio and improve the display quality of the array substrate, in an example, at least a part of the vertical portion 21 overlaps with the data line 3 in a direction perpendicular to the substrate. Further, in an example, the vertical portion 21 completely overlaps with the data line 3 in the direction perpendicular to the substrate.

As a first implementation of the invention, as illustrated in FIGS. 2 and 3, the array substrate has a top-gate configuration. In the top-gate configuration, the data lines 3 are directly deposited on the substrate 1, the scan lines 4 are disposed in the top layer of the array substrate.

For the convenience of electrically connecting the scan lines 4 and the scan connection lines 2, in an example, the array substrate further comprises bridge connection lines 6; the scan lines 4 are electrically connected to the scan connection lines 2 by way of the bridge connection lines 6.

To facilitate the fabrication, in an example, the bridge connection lines 6 are in the same layer as the data lines 3, and the scan connection lines 2 are in the same layer as the scan lines 4; the bridge connection lines 6 are electrically connected to the scan lines 4 by way of the first via holes 10, the bridge connection lines 6 are electrically connected to the scan connection lines 2 by way of second via holes 12. In the example, the bridge connection lines 6 is deposited at the same time as the data lines 3 (the bridge connection lines 6 may be made of the same metal as the data lines 3), and the scan connection lines 2 is deposited at the same time as the scan lines 4 (the scan connection lines 2 may be made of the same metal as the scan lines 4).

In the disclosure, there is no special requirement on the number of the first via holes 10 and that of the second via holes 12. Generally, the numbers of the first and second via holes 10 and 12 may be determined according to specific configurations. In the following, the way of determining the numbers of the first and second via holes 10 and 12 will be described in connection with FIGS. 2 to 4 and FIG. 6.

Figure 4:
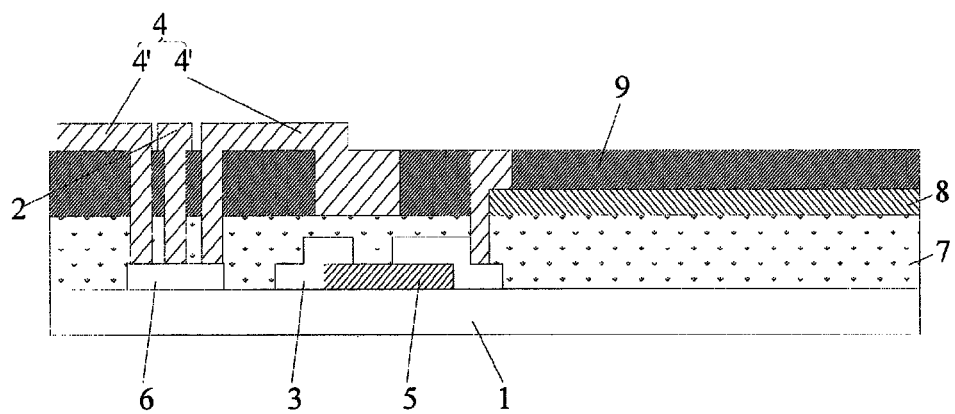
FIG. 4 schematically illustrates a cross section of an array substrate in accordance with a second implementation of the invention.

To increase the aperture ratio and improve the display quality of the array substrate, in an example, a length direction of the bridge connection lines 6 is the same as that of the scan lines 4 as illustrated in FIG. 3. In this case, each scan line 4 comprises a plurality of discontinuous parts 4', and the plurality of parts 4' are electrically connected with each other by way of the bridge connection lines 6. As illustrated in FIGS. 2 to 4, each scan line 4 comprises two parts 4', two first via holes 10 are respectively disposed on both ends of a bridge connection line 6 to electrically connect the adjacent two parts 4', while the second via hole 12 is disposed in the middle of the bridge connection line 6. In other words, each bridge connection line 6 is electrically connected to a corresponding scan line 4 by way of two first via holes 10.

Figure 6:
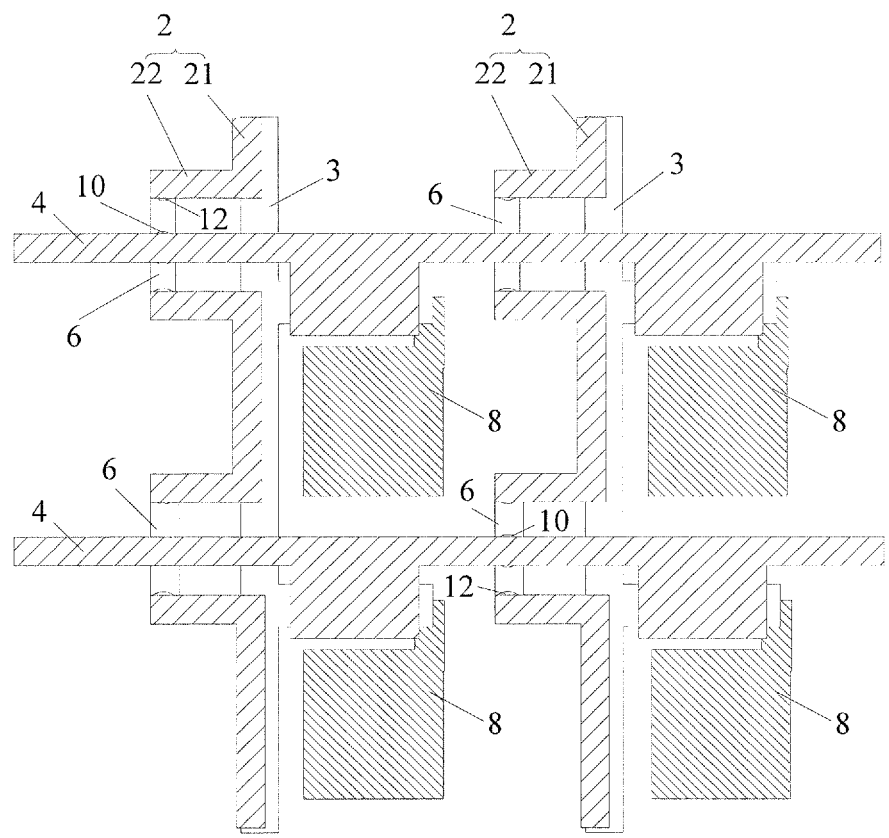
FIG. 6 schematically illustrates a cross section of an array substrate in accordance with a third implementation of the invention.

In the two implementations illustrated in FIGS. 2 to 4, the length direction of the bridge connection lines 6 is the same as that of the scan lines 4. However, the disclosure is not limited to the implementations. As a third implementation of the invention, as illustrated in FIG. 6, the length direction of the bridge connection lines 6 is not the same as that of the scan lines 4, instead, they are perpendicular to each other. In this case, the scan liens 4 are continuous, while the scan connection lines 2 are discontinuous. Similarly, the scan lines 4 are electrically connected with the bridge connection lines 6 by way of the first via holes 10, while the scan connection lines 2 are electrically connected with the bridge connection lines 6 by way of the second via holes 12. As illustrated in figures, a first via hole 10 is disposed accordingly on each bridge connection line 6 and configured for electrically connecting the corresponding scan line 4; while two second via holes 12 are disposed accordingly on each bridge connection line 6 and configured for electrically connecting the corresponding scan connection line 2.

In the disclosure, the number of the bridge connection lines 6 may be the same as that of the scan connection lines 2. That is, the bridge connection lines 6 are only disposed at locations where the individual scan lines 4 are connected to the corresponding scan connection lines 2.

As illustrated in FIG. 3, each scan connection line 2 comprises a plurality of horizontal portions 22 and a plurality of vertical portions 21.

In the array substrate provided by the disclosure, the data lines 3 and the bridge connection lines 6 are disposed in the same layer; the scan lines 4 and the scan connection lines 2 are disposed in the same layer. The data lines 3, the bridge connection lines 6, the scan lines 4 and the scan connection lines 2 may be formed by performing two deposition steps, thereby simplifying the process and saving the production time.

In an example, a protection layer 9 is disposed on an insulating layer 7 of the array substrate. To improve the aperture ratio of the array substrate, both the insulating layer 7 and the protection layer 9 normally have relatively large thickness. In such a way, a width of the pixel electrodes 8 in the planar plane is increased; meanwhile, the data lines 3 and the scan connection lines 2 are separated, reducing the interference between the data lines 3 and the scan connection lines 2.

Figure 5:
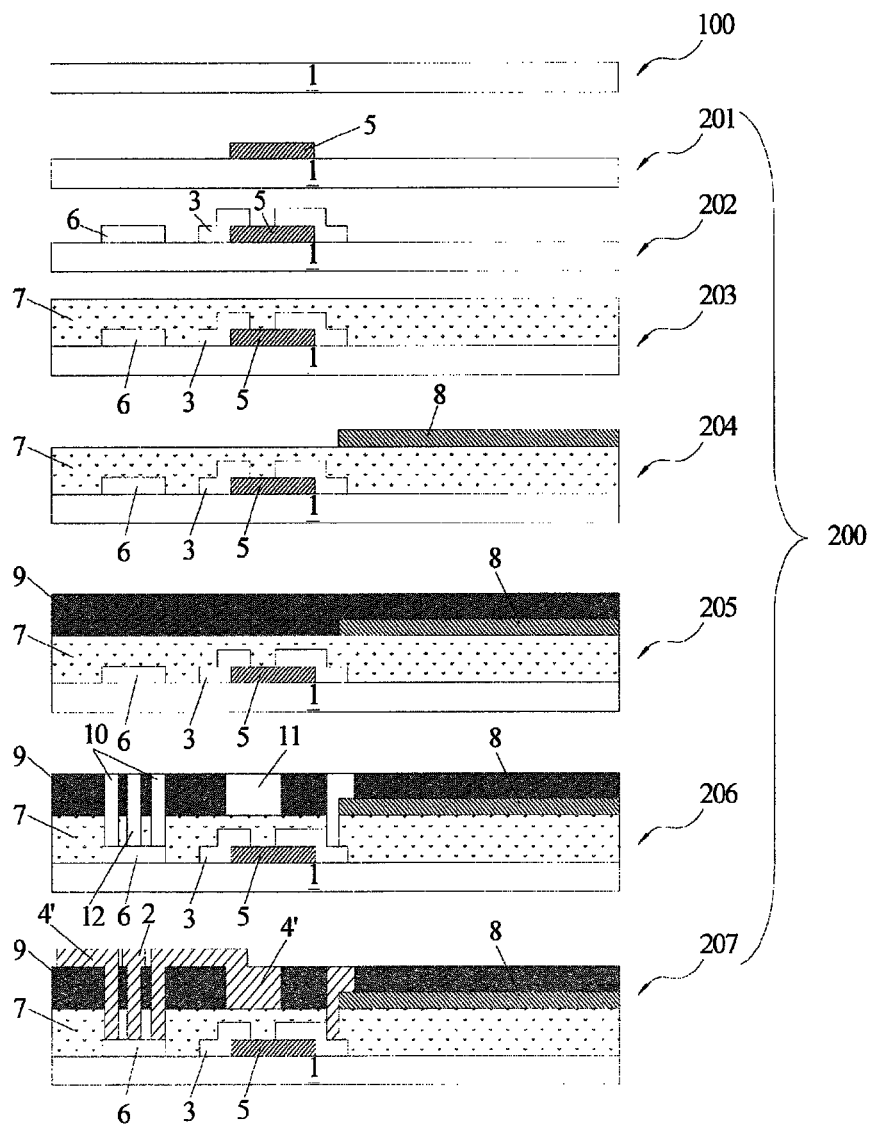
FIG. 5 is a process flow for fabricating the array substrate of FIG. 4.

In an example, to prevent driving voltage of the TFT from being affected by the over-thick insulating layer 7 and the protection layer 9, a groove 11 is disposed on the protection layer 9. The groove 11 is disposed above an active layer 5 of the array substrate (as illustrated in FIG. 5), a part of the scan line 4 is embedded in the groove (as illustrated in FIGS. 4 and 5). In this way, the distance between the gate electrode and the active layer is further shortened, which facilitates to decrease the turn-on voltage. In an example, the groove 11 penetrates through the protection layer 9. The groove 11 may be formed at the same time as the first via holes 10 and the second via holes 12.

Figure 7:
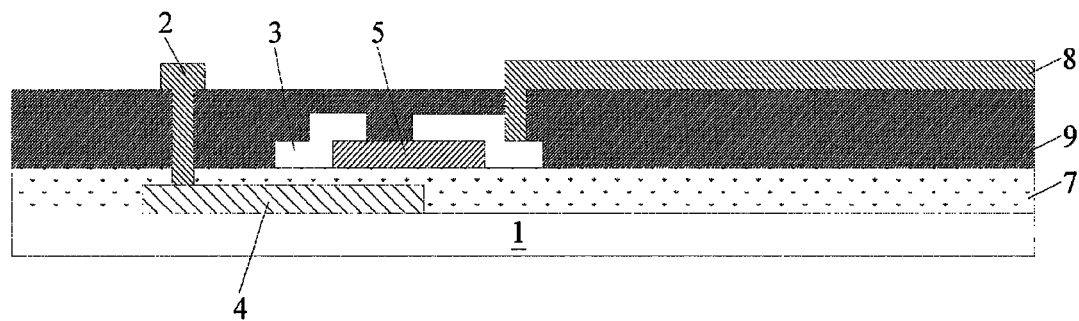
FIG. 7 schematically illustrates a cross section of an array substrate in accordance with a fourth implementation of the invention.
Figure 8:
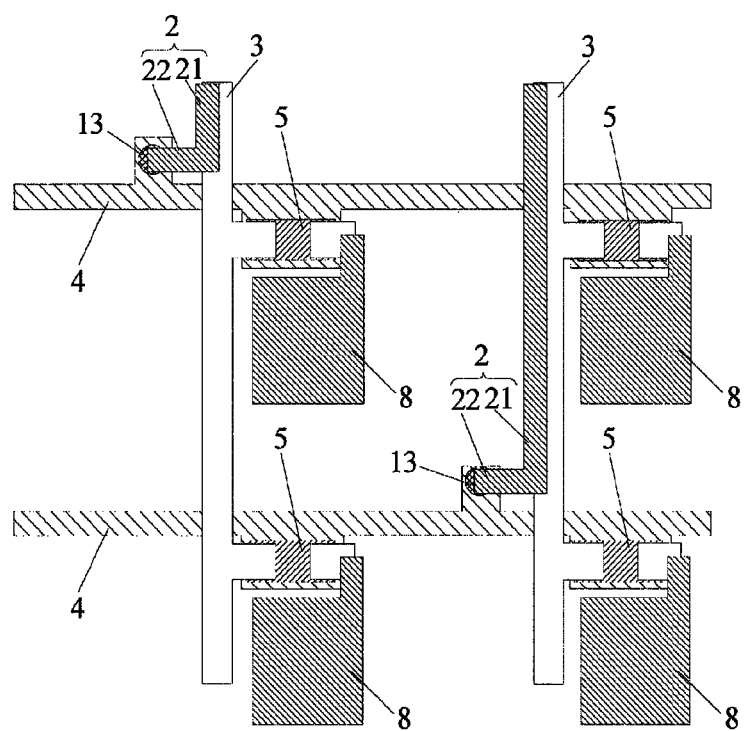
FIG. 8 schematically illustrates a top view of the array substrate of FIG. 7.
Figure 9:
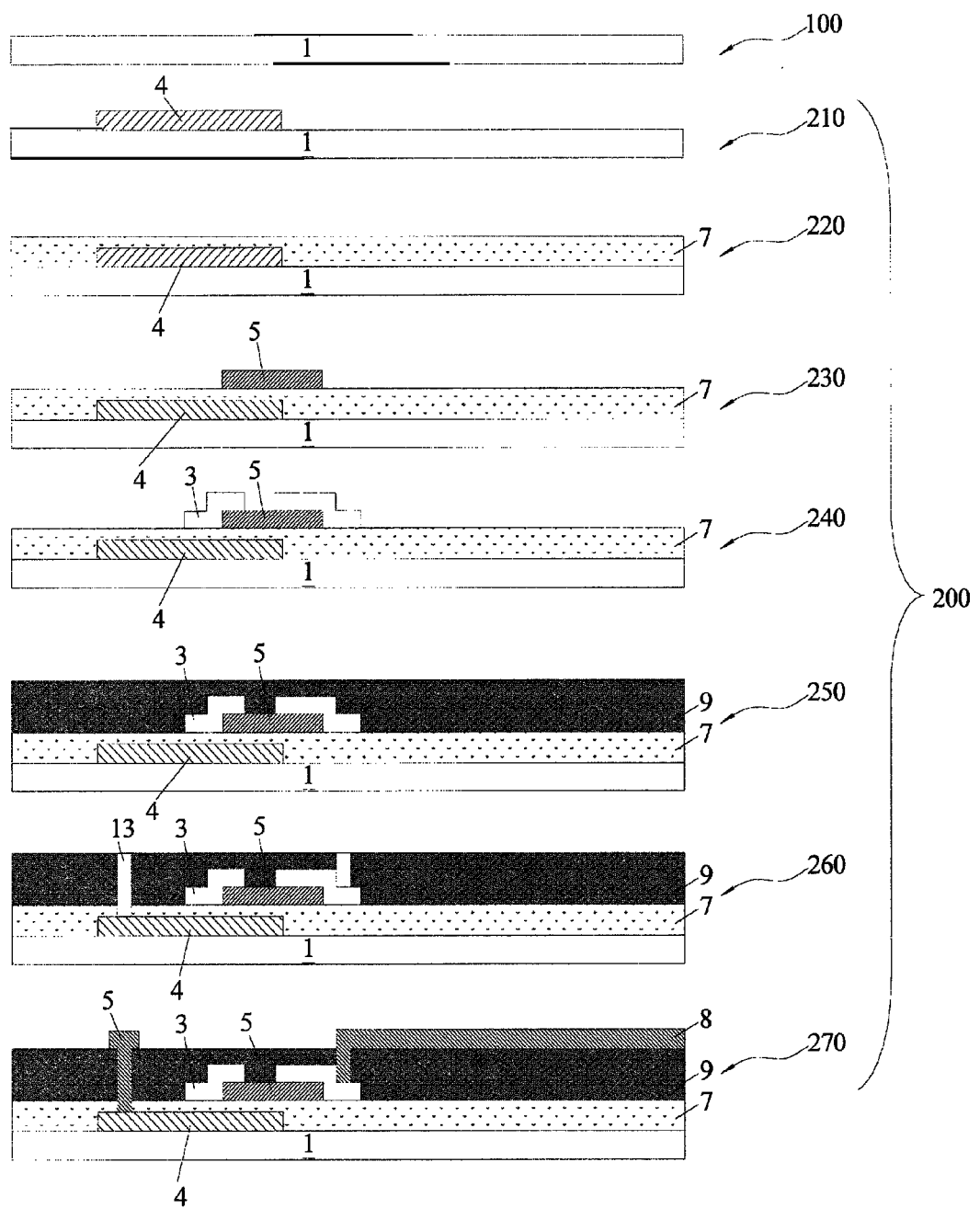
FIG. 9 is a process flow for fabricating the array substrate of FIG. 7 and FIG. 8.

As a fourth implementation of the invention, the array substrate has a bottom-gate configuration. That is, as illustrated in FIGS. 7 to 9, the scan lines 4 are directly disposed on the substrate 1, the data lines 3 are disposed above the scan lines 4. As illustrated in FIG. 8, each connection line 2 only comprises one horizontal portion 22 and one vertical portion 21.

In this implementation, the scan connection lines 2 and pixel electrodes 8 of the array substrate are disposed in the same layer, the scan connection lines 2 are electrically connected to the scan lines 4 by way of third via holes 13. The scan connection lines 2 may be deposited at the same time as the pixel electrodes 8 (the scan connection lines 2 and the pixel electrodes 8 may be made of the same metal).

Another aspect of the invention further provides a liquid crystal panel; the liquid crystal panel comprises the above array substrate provided by the disclosure. As the array substrate has a relatively narrow frame region, the liquid crystal panel also has a relatively narrow frame region.

As an implementation, the liquid crystal panel further comprises a color filter substrate disposed as opposed to the array substrate.

As illustrated in FIGS. 5 to 9, still another aspect of the invention further provides a method for fabricating an array substrate; the array substrate is the above array substrate provided by the disclosure, and the method comprises the following steps:

Step 100: providing a substrate 1, the substrate 1 comprising a display region and a frame region surrounding the display region;

Step 200: respectively depositing and patterning metal layers on the substrate 1, so as to form a plurality of scan connection lines 2, a plurality of scan lines 3 and a plurality of data lines 4 in the display region; the plurality of data lines 3 and the plurality of scan lines 4 intersect each other to divide the display region into a plurality of pixel regions, the plurality of scan lines 4 are electrically connected to the plurality of scan connection lines 2 in a one-to-one correspondence in the display region.

As the scan lines 4 are electrically connected to the scan connection lines 2 in the display region, the frame region will not be taken up. As a result, the array substrate provided by the disclosure can have a narrower frame region.

In the following, a method for fabricating an array substrate having a top-gate configuration will be described with reference to FIG. 5. As illustrated in FIG. 5, the step 200 comprises the following steps:

Step 201, forming an active layer pattern on the substrate 1;

Step 202, forming a data line 3 and a bridge connection line 6 on the substrate done with step 201;

Step 203, forming an insulating layer 7 on the substrate done with step 202, the insulating layer 7 overlaying whole of the substrate;

Step 204, forming a pixel electrode 8 on the insulating layer 7;

Step 205, forming a protection layer 9 on the substrate done with step 204, the protection layer 9 overlaying whole of the substrate;

Step 206, forming first via holes 10 and a second via hole 12 on the substrate done with step 205, both the first via holes 10 and the second via hole 12 penetrating through the insulating layer 7 and the protection layer 9 to reach the bridge connection lines 6;

Step 207, forming a scan line 4 and a scan connection line 2 on the protection layer 9, the scan line 4 and the scan connection line 2 being connected to the bridge connection line 6 respectively by way of the first via holes 10 and the second via hole 12.

It is seen from the above description that the data lines 3, the bridge connection lines 6, the scan lines 4 and the scan connection lines 2 may be obtained by depositing two layers of metals.

In the disclosure, the protection layer 9 may be made of an organic material. As an example, the protection layer 9 is made of PVX.

Optionally, a groove 11 is disposed in the protection layer 9 and disposed above the active layer 5, a part of the scan line 4 is embedded in the groove 11. Therefore, step 206 may further comprise a step of forming the groove 11 in the protection layer 9, the groove being disposed above the active layer 5. When forming the scan line 4 at step 207, the metal of the scan line 4 will enter the groove 11, allowing a part of the scan line 4 to be embedded in the groove 11. In an example, the groove 11 penetrates through the protection layer 9.

A method for forming the array substrate of the third implementation is more or less the same as those for fabricating the array substrates of the first and second implementations, which will not be elaborated here.

In the following, a method for fabricating an array substrate having a bottom-gate configuration will be described with reference to FIG. 9. As illustrated in FIG. 9, the step 200 comprises the following steps:

Step 210, forming a scan line 4 on the substrate 1;

Step 220, forming an insulating layer 7 on the substrate done with step 210, the insulating layer 7 overlaying whole of the substrate;

Step 230, forming an active layer pattern 5 on the insulating layer 7;

Step 240, forming a data line 3 on the insulating layer 7;

Step 250, forming a protection layer 9 on the substrate done with step 240, the protection layer 9 overlaying whole of the substrate;

Step 260, forming a third via hole 13 on the substrate done with step 250, the third via holes 13 penetrating through the protection layer 9 and the insulating layer 7 to reach the scan line 4;

Step 270, forming a pixel electrode 8 and scan connection line 2 on the substrate done with step 260, the scan connection line 2 are electrically connected to the scan line 3 by way of the third via hole 13.

It is seen from the above description that the scan line 4, the pixel electrode 8 and the scan connection line 2 may be obtained by depositing two layers of metals.

What are described above is related to the illustrative embodiments of the disclosure only and not limitative to the scope of the disclosure; the scopes of the disclosure are defined by the accompanying claims.

What is claimed is:

1. An array substrate, comprising:
a display region; and
a frame region surrounding the display region;
the display region comprising a plurality of data lines, a plurality of scan lines and a plurality of scan connection lines, the plurality of data lines and the plurality of scan lines intersecting each other to divide the display region into a plurality of pixel regions,
wherein the plurality of scan lines are electrically connected to the plurality of scan connection lines in a one-to-one correspondence in the display region;
the array substrate has a top-gate configuration, the display region further comprises a bridge connection line, the scan lines are electrically connected to the scan connection lines by way of the bridge connection line; and
the bridge connection line is disposed in the same layer as the data lines, the scan connection lines are disposed in the same layer as the scan lines, the bridge connection line is electrically connected to the scan lines by way of a first via hole, the bridge connection line is electrically connected to the scan connection lines by way of a second via hole.

2. The array substrate of claim 1, wherein the scan connection lines comprise a vertical portion and a horizontal portion, the horizontal portion is electrically connected to the scan lines, and the vertical portion is disposed parallel to the data lines.

3. The array substrate of claim 2, wherein at least a part of the vertical portion overlaps with the data line in a direction perpendicular to the substrate.

4. The array substrate of claim 2, wherein the array substrate has a top-gate configuration, the display region further comprises a bridge connection line, the scan lines are electrically connected to the scan connection lines by way of the bridge connection line.

5. The array substrate of claim 2, wherein the array substrate has a bottom-gate configuration, the scan connection lines and a pixel electrode of the array substrate are disposed in the same layer, the scan connection lines are electrically connected to the scan lines by way of a third via hole.

6. The array substrate of claim 3, wherein the array substrate has a top-gate configuration, the display region further comprises a bridge connection line, the scan lines are electrically connected to the scan connection lines by way of the bridge connection line.

7. The array substrate of claim 3, wherein the array substrate has a bottom-gate configuration, the scan connection lines and a pixel electrode of the array substrate are disposed in the same layer, the scan connection lines are electrically connected to the scan lines by way of a third via hole.

8. The array substrate of claim 1, wherein a length direction of the bridge connection line is the same as those of the scan lines, and the bridge connection line is electrically connected to a corresponding scan line by way of at least two first via holes.

9. The array substrate of claim 1, wherein a protection layer is disposed on an insulating layer of the array substrate, a groove is disposed in the protection layer, the groove is disposed above an active layer of the array substrate, a part of the scan lines are embedded in the groove.

10. The array substrate of claim 1, wherein the array substrate has a bottom-gate configuration, the scan connection lines and a pixel electrode of the array substrate are disposed in the same layer, the scan connection lines are electrically connected to the scan lines by way of a third via hole.

11. A liquid crystal panel comprising the array substrate of claim 1.

12. The liquid crystal panel of claim 11, wherein the scan connection lines comprise a vertical portion and a horizontal portion, the horizontal portion is electrically connected to the scan lines, and the vertical portion is disposed parallel to the data lines.

13. The liquid crystal panel of claim 11, wherein the array substrate has a top-gate configuration, the display region further comprises a bridge connection line, the scan lines are electrically connected to the scan connection lines by way of the bridge connection line.

14. The liquid crystal panel of claim 12, wherein at least a part of the vertical portion overlaps with the data lines in a direction perpendicular to the substrate.

15. A method for fabricating an array substrate, comprising steps of:
   providing a substrate, the substrate comprising a display region and a frame region; and
   forming, on the substrate, a plurality of data lines, a plurality of scan lines and a plurality of scan connection lines, the plurality of scan lines being electrically connected to the plurality of scan connection lines in a one-to-one correspondence in the display region;
   wherein the step of providing the substrate, the substrate comprising a display region and a frame region comprises:
   forming an active layer pattern on the substrate;
   forming the data lines and a bridge connection line on the substrate having the active layer pattern formed thereon;
   forming an insulating layer on the substrate having the data lines and the bridge connection line formed thereon, the insulating layer overlaying the substrate;
   forming a pixel electrode on the insulating layer;
   forming a protection layer on the substrate having the pixel electrode formed thereon, the protection layer overlaying the substrate;
   forming a first via hole and a second via hole on the substrate having the protection layer formed thereon, both the first via hole and the second via hole penetrating the insulating layer and the protection layer to reach the bridge connection line;
   forming the scan lines and the scan connection lines on the protection layer, the scan lines and the scan connection lines being connected to the bridge connection line by way of the first via hole and the second via hole, respectively.

16. The method of claim 15, wherein the step of forming the first via hole and the second via hole on the substrate having the protection layer formed thereon, both the first via hole and the second via hole penetrating the insulating layer and the protection layer to reach the bridge connection line further comprises:
   forming a groove on the protection layer.

17. The method of claim 15, wherein the step of forming the plurality of data lines, the plurality of scan lines and the plurality of scan connection lines on the substrate, the plurality of scan lines being electrically connected to the plurality of scan connection lines in a one-to-one correspondence in the display region comprises:
   forming the scan lines on the substrate;
   forming an insulating layer on the substrate having the scan lines formed thereon, the insulating layer overlaying the substrate;
   forming an active layer pattern on the insulating layer;
   forming the data lines on the insulating layer;
   forming a protection layer on the substrate having the data lines formed thereon;
   forming a third via hole on the substrate having the protection layer formed thereon, the third via hole penetrating through the protection layer and the insulating layer to reach the scan lines;
   forming a pixel electrode and a scan connection lines on the substrate having the third via hole, the scan connection lines are electrically connected to the scan lines by way of the third via hole.

* * * * *